(12) United States Patent
Laslo et al.

(10) Patent No.: US 10,656,191 B2
(45) Date of Patent: May 19, 2020

(54) CAPACITANCE MEASURING CIRCUIT

(71) Applicant: Microsoft Technology Licensing, LLC, Redmond, WA (US)

(72) Inventors: Ori Laslo, Rehovot (IL); Eran Arbel, Netanya (IL); Meborach Bublil, Netanya (IL)

(73) Assignee: Microsoft Technology Licensing, LLC, Redmond, WA (US)

(*) Notice: Subject to any disclaimer, the term of this patent is extended or adjusted under 35 U.S.C. 154(b) by 101 days.

(21) Appl. No.: 15/846,199

(22) Filed: Dec. 18, 2017

(65) Prior Publication Data
US 2019/0187196 A1 Jun. 20, 2019

(51) Int. Cl.
*G01R 27/26* (2006.01)
*H03K 17/955* (2006.01)
*G06F 3/041* (2006.01)

(52) U.S. Cl.
CPC ....... *G01R 27/2605* (2013.01); *G06F 3/0416* (2013.01); *H03K 17/955* (2013.01)

(58) Field of Classification Search
CPC .. G01R 27/2605; G06F 3/0416; H03K 17/955
See application file for complete search history.

(56) References Cited

U.S. PATENT DOCUMENTS

| 6,969,978 B2 | 11/2005 | Dening |
| 8,836,666 B2 | 9/2014 | Brosnan |
| 8,941,394 B2 | 1/2015 | Martin et al. |
| 9,170,322 B1 | 10/2015 | Anderson et al. |
| 9,541,589 B2 | 1/2017 | Han |
| 2001/0008478 A1 | 7/2001 | McIntosh et al. |

(Continued)

FOREIGN PATENT DOCUMENTS

| EP | 2722985 A1 | 4/2014 |
| GB | 2425843 A | 11/2006 |

OTHER PUBLICATIONS

"International Search Report and Written Opinion Issued in PCT Application No. PCT/US2018/062689", dated Feb. 26, 2019, 12 Pages.

*Primary Examiner* — David M. Gray
*Assistant Examiner* — Michael A Harrison

(57) ABSTRACT

In various examples there is a capacitance measurement circuit for measuring capacitance of an electrode. The circuit comprises a charging/discharging circuit part which charges the electrode or discharges the electrode, and a counter which measures a charging measurement being a time taken by the charging/discharging circuit part to charge the electrode between two charging thresholds, and which measures a discharging measurement being a time taken by the charging/discharging circuit part to discharge the electrode between two discharging thresholds. The circuit has a controller configured to control the charging/discharging circuit part and the counter such that a plurality of discharging measurements are obtained and a plurality of charging measurements are obtained. The circuit has an averaging logic which computes the measured capacitance in relation to an average of the measurements. In this way high frequency and low frequency noise is attenuated and fine resolution, high accuracy capacitance measurements are obtained.

20 Claims, 11 Drawing Sheets

(56) References Cited

U.S. PATENT DOCUMENTS

| | | | |
|---|---|---|---|
| 2008/0142281 A1* | 6/2008 | Geaghan | G06F 3/044 178/18.06 |
| 2009/0167325 A1 | 7/2009 | Geaghan | |
| 2011/0267309 A1 | 11/2011 | Hanauer et al. | |
| 2016/0305835 A1 | 10/2016 | Kollias et al. | |

* cited by examiner

CAPACITANCE MEASURING CIRCUIT

BACKGROUND

The technology generally relates to capacitance measuring circuits for measuring capacitance of an electrode. Capacitance measurement is used in many applications including capacitive touch screens, digital styluses, pressure sensors and others.

Accuracy of capacitance measurements affects the quality of the application concerned such as the quality of control of a graphical user interface a user can achieve via a touch screen, or the accuracy of estimation of the density of a gas in a container where the pressure is measured by a pressure sensor. Accuracy is affected by many factors including noise, changes in temperature, changes in humidity and other factors.

The resolution of the capacitance measurements also affects the quality of the application where the capacitance measurements are being used. If the resolution is too coarse then low capacitance touch events may be interpreted as the absence of a touch event by a capacitive touch screen. If the resolution is too coarse then small differences in pressure may be undetected by a pressure sensor using capacitance. Resolution is affected by many factors including the design of the capacitance measurement circuit and the environment of the electrode.

The embodiments described below are not limited to implementations which solve any or all of the disadvantages of known capacitance measuring circuits.

SUMMARY

The following presents a simplified summary of the disclosure in order to provide a basic understanding to the reader. This summary is not intended to identify key features or essential features of the claimed subject matter nor is it intended to be used to limit the scope of the claimed subject matter. Its sole purpose is to present a selection of concepts disclosed herein in a simplified form as a prelude to the more detailed description that is presented later.

In various examples there is a capacitance measurement circuit for measuring capacitance of an electrode. The circuit comprises a charging/discharging circuit part which charges the electrode or discharges the electrode, and a counter which measures a charging measurement being a time taken by the charging/discharging circuit part to charge the electrode between two charging thresholds, and which measures a discharging measurement being a time taken by the charging/discharging circuit part to discharge the electrode between two discharging thresholds. The circuit has a controller configured to control the charging/discharging circuit part and the counter such that a plurality of discharging measurements are obtained and a plurality of charging measurements are obtained. The circuit has an averaging logic which computes the measured capacitance in relation to an average of the measurements. In this way high frequency and low frequency noise is attenuated and fine resolution, high accuracy capacitance measurements are obtained.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

Figure 1:
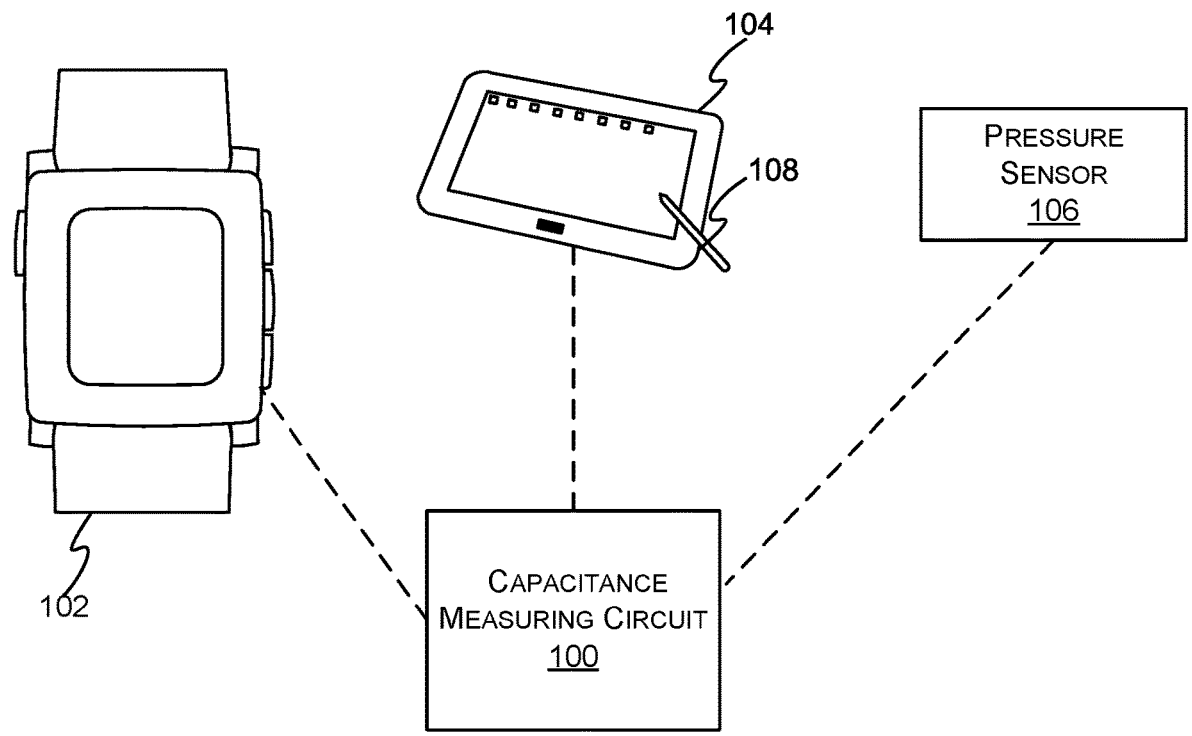
FIG. 1 is a schematic diagram of a capacitance measuring circuit.

The detailed description provided below in connection with the appended drawings is intended as a description of the present examples and is not intended to represent the only forms in which the present example are constructed or utilized. The description sets forth the functions of the example and the sequence of operations for constructing and operating the example. However, the same or equivalent functions and sequences may be accomplished by different examples.

The present technology provides circuitry for measuring capacitance of an electrode by using an approach which operates in the time domain. The electrode is charged (or discharged) between two specified voltages and the time taken for the charging (or discharging) is recorded. This time is known to be proportional to the capacitance of the electrode, which is proportional to the amount of charge held or stored by the electrode at the time of the measurement.

Capacitance measurement in the time domain is particularly well suited to applications where fine scale capacitance resolution and low power operation is desired, such as touch sensor technology, pressure sensitive stylus technology, and other pressure sensor technology. This is because the time taken for the charging or discharging can be measured at a fine resolution in a practical and accurate manner by using a clock signal with a high frequency. Alternatives, such as capacitance measurement in the frequency domain are not so well suited to low power capacitance measurement because it requires an alternating current (AC) transmission, a high-end analog to digital converter (ADC) and a complex digital signal processing (DSP) module which take up power and space.

However, a significant problem with capacitance measurement in the time domain is that noise makes the measurements inaccurate. This gives problems for whichever application the capacitance measurements are being used for such as detecting touch events which are noise and not real touch events; failing to detect real touch events; giving a pressure value which is too high or too low, or others. It is recognized herein that various different types of noise influence the capacitance measurement results and the different types of noise act in different ways.

Where the capacitance measuring circuit is inside an electronic device such as a smart phone, smart watch, laptop computer, tablet computer, game controller or other device it typically experiences noise from other components inside the electronic device, such as a liquid crystal display, a near field communications antenna or control circuitry, a short range wireless communications antenna such as a Bluetooth (trade mark) antenna, a direct current to direct current converter, or other component. The capacitance measuring circuit also typically experiences noise from sources external to the electronic device such as lighting in the room the device is in, motors and other equipment where the device is in a vehicle, communications networks such as Ethernet (trade mark) cables in a building where the electronic device is located and others.

Consider a time period of an individual sample during which an electrode is charged (or discharged) to find the time taken for that charging or discharging to occur. If noise occurs during this time period it will influence the measurement results unless the noise is somehow removed from the measurement or its effects ameliorated.

In the case of low frequency noise where the wavelength of the noise is much larger than the measurement time period, then the noise is effectively constant during the measurement time period. In the case of high frequency noise this is not the case and one or more pulses of high frequency noise may occur during the measurement time. Low frequency noise such as 50 to 60 Hertz noise from an electrical network has a period of around 20 milliseconds which is much larger than a typical measurement time of around 100 micro seconds.

The present technology takes a plurality of measurements, each one comprising a discharge time or a charging time, and averages the measurements in order to reduce the effects of the noise. Averaging the measurements acts to reduce the high frequency noise since the random effects of the high frequency noise pulses cancel one another out. In the case of low frequency noise, the averaging on its own cannot remove the low frequency noise since it is effectively the same in each individual measurement. However, it is recognized herein that low frequency noise has an opposite effect on charging and discharging measurements. Thus the plurality of measurements is arranged to comprise charging measurements and discharging measurements. In a preferred embodiment the plurality of measurements is arranged to comprise approximately the same number of charging measurements as discharging measurements in order to attenuate the low frequency noise.

FIG. 1 is a schematic diagram of capacitance measuring circuit 100 which is deployed in an electronic device such as a smart watch 102 with a touch screen, a tablet computer 104, a stylus 108, and a pressure sensor 106. The time-domain capacitance measurement circuitry is a dedicated integrated circuit in some examples, and is sold separately as an individual component. In some examples, the capacitance measuring circuit 100 is one of many such capacitance measuring circuits within a control module 216 (see FIG. 2) of a touch panel. The capacitance measuring circuit 100 is used in a stylus or a pressure sensor in some examples.

Electronic devices such as tablet computers, smart phones, smart watches and others often incorporate a touch panel to display information and to receive one or more user inputs made by touching the display. The touch panel is typically a mutual capacitance touch panel with a capacitive sensing medium referred to as a digitizer device incorporating a plurality of row electrodes (referred to as transmit electrodes) and a plurality of column electrodes (referred to as receive electrodes) arranged in a rectangular grid pattern. A drive signal voltage is applied on the transmit electrodes and a voltage is measured at each receive electrode. Since the human body is an electrical conductor, when a finger touches or comes close to the touch panel, an electrostatic field of the touch panel is distorted and this produces a measurable change at the receive electrodes.

Coordinates of the user input at the touch panel are computed from the measured change and interpolation may be used to compute coordinates of user input positions within individual cells of the grid rather than at intersections of the grid.

Where a stylus 108 or pen is used in conjunction with the touch panel, the stylus or pen incorporates one or more drive electrodes (referred to herein as transmitters) so that drive electrodes at the touch panel itself may be used as receive electrodes.

A touch panel (referred to as a digitizer herein for brevity) is typically used with a display although this is not essential. The display comprises a display panel which may be located in front of or behind the digitizer such as in a conventional smart phone, tablet computer, or smart watch. In some cases the digitizer is a touch pad which is located remote from the display panel as in the case of a laptop computer.

Figure 2:
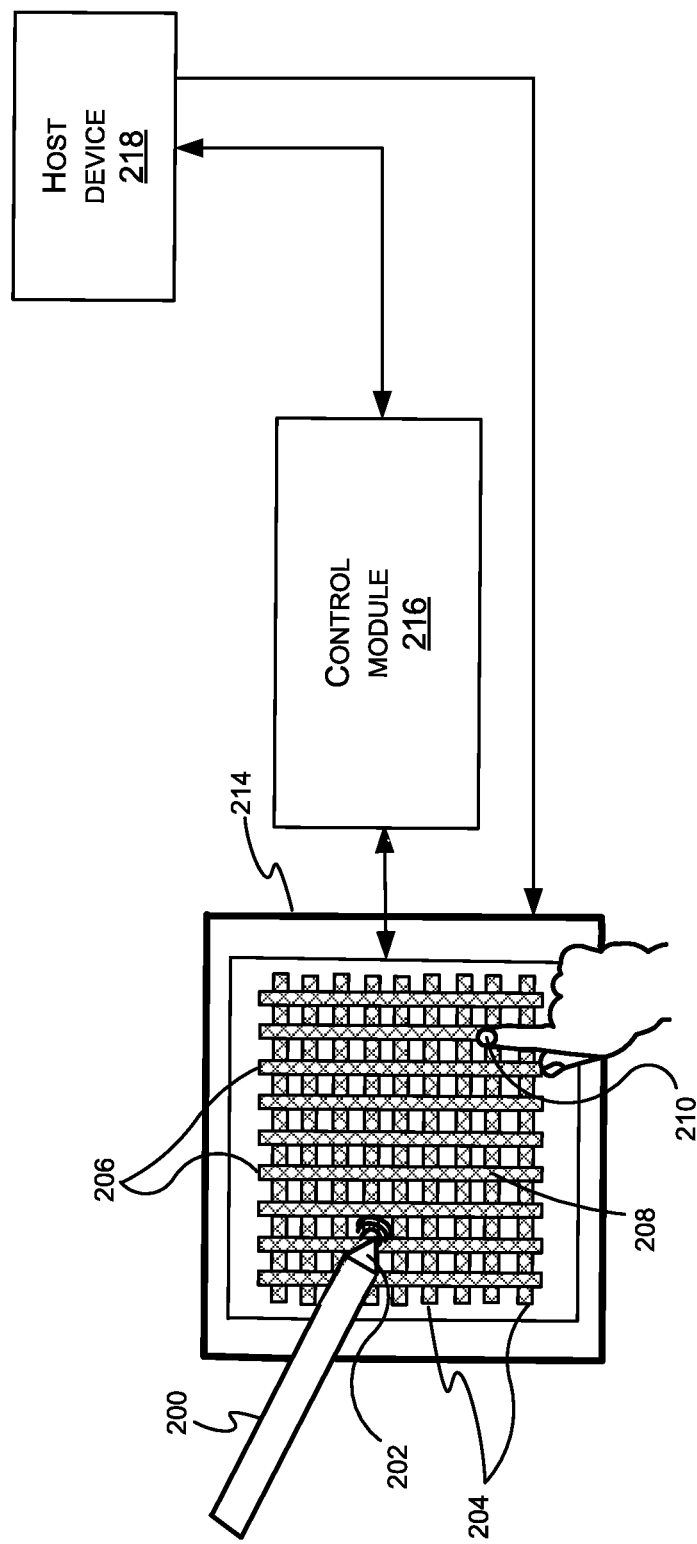
FIG. 2 is a schematic diagram of a touch panel sensor.

An example of a digitizer 214 is illustrated in FIG. 2 and comprises a first array of electrodes arranged substantially parallel with one another and a second array of electrodes arranged substantially parallel with one another. Substantially parallel means within a few degrees of parallel. In some implementations the electrodes in the first array are row electrodes positioned substantially perpendicular to the electrodes in the second array (column electrodes) to form a grid or matrix as illustrated in FIG. 2. While the row electrodes may be referred to as transmit electrodes and the column electrodes may be referred to as receive electrodes, these designations may be reversed with no change in meaning. However, it is not essential for the electrodes to be arranged in a grid. In some cases the row electrodes intersect each column electrode an at angle that is not perpendicular thereby forming a sensor having the form of a parallelogram. In some cases the electrodes form a more complex pattern in which any two rows or columns are not necessarily parallel, or not necessarily laid out along straight lines.

Where the sensor panel is used in front of or within a display (such as a liquid crystal display) the digitizer 214 is substantially transparent to visible wavelengths of light. Specifically, the electrodes in the digitizer are made from transparent conductive material (for example, indium tin oxide), or alternatively, are made from opaque material but with traces so small as to be inconspicuous). In other implementations, the digitizer is not positioned within, in front or behind a display but rather is positioned within a touch pad distinct from the display of the electronic device.

The digitizer 214 is used to measure the capacitance from each row to each column of the electrodes in order to measure the position of an input medium such as a finger, or stylus. In some operation modes, the capacitance between one of the row/column electrodes and the system's ground is measured in order to provide low-power touch detection or in order to provide inputs to a touch detection algorithm.

FIG. 2 shows the digitizer in a case where the electrodes of the digitizer are arranged in a grid to form a grid based capacitive sensor <Ori: active pen is not detected by capacitance sensor>. Stylus 200 transmits an electromagnetic signal which is detected by the capacitive sensor. Touch of one or more fingers 210 or other conductive objects is also detectable by the capacitive sensor. The stylus 200 transmits one or more signal bursts and/or pulses that are transmitted at a defined repetition rate. In some examples, a control module 216 of the digitizer manages a synchronization signal for synchronizing signal bursts emitted by stylus 200 with sampling windows for sampling output from the digitizer 214. Optionally one or more signal bursts and/or pulses are transmitted by stylus 200 including information regarding operation of stylus 200 and/or pressure applied on a tip 202 of the stylus. The signal bursts transmitted by stylus 200 are picked up by one or more of the electrodes of the digitizer 214 on both the horizontal and vertical axes of the grid. In some examples the information is decoded by digitizer circuitry in the control module 216. The location of the stylus tip is computed by the control module 216 and sent to host device 218 which is a computing device with which the digitizer is associated.

Optionally a mutual capacitance detection method and/or a self-capacitance detection method are applied on the digitizer 214 for sensing interaction with fingertip of one or more fingers 210. The digitizer control module 216 sends a triggering pulse and/or interrogation signal to one or more electrodes 204, 206 of the digitizer and to sample output from electrodes 204, 206 in response to the triggering and/or interrogation. In some embodiments some or all of the electrodes 204 along one axis of the grid are interrogated simultaneously or in a consecutive manner, and in response to each interrogation, outputs from electrodes 206 on the other axis are sampled. This scanning procedure provides for obtaining output associated with each junction 208 of the grid. This provides for detecting one or more conductive objects such as fingertips touching and/or hovering over the digitizer at the same time (multi touch). In some examples, the digitizer control module 216 alternates between scanning the digitizer 214 for detection of one or more fingertips and sampling outputs on both the horizontal and vertical electrodes for location of a signal transmitted by the stylus 200.

The stylus 200 has a tip transmitter located in its tip 202 and the digitizer is able to detect the position of the stylus tip with respect to the digitizer grid by detecting the signal transmitted by the tip transmitter.

In various examples, the stylus has a tilt transmitter. The digitizer is able to detect tilt of the stylus 200 with respect to the plane of the digitizer 214 where the stylus 200 has a tilt transmitter in addition to a transmitter at the tip 202 of the stylus. The stylus contains a transmitter at its tip which transmits a first signal and it contains a second transmitter (referred to as a tilt transmitter) at a tilt point of the transmitter which transmits a second signal, different from the first signal. The control module 216 computes the location on the digitizer 214 of the tip 202 of the stylus 200 using the first signal. The control module 216 computes the location on the digitizer 214 of the signal received from the tilt point of the stylus 200 using the second signal. The control module 216 knows the length of the stylus 200 and is thus able to compute by triangulation the angle between the longitudinal axis of the stylus 200 and the plane of the digitizer 214.

In various examples the stylus has a plurality of transmitters configured to enable the digitizer and control module 216 to detect rotation of the stylus 200.

The digitizer is able to detect position of a distal end of the stylus 200 where the stylus has at least one transmitter at its distal end. Where the distal end of the stylus 200 is used as an eraser the distal end transmitter is referred to as an eraser transmitter.

Figure 3:
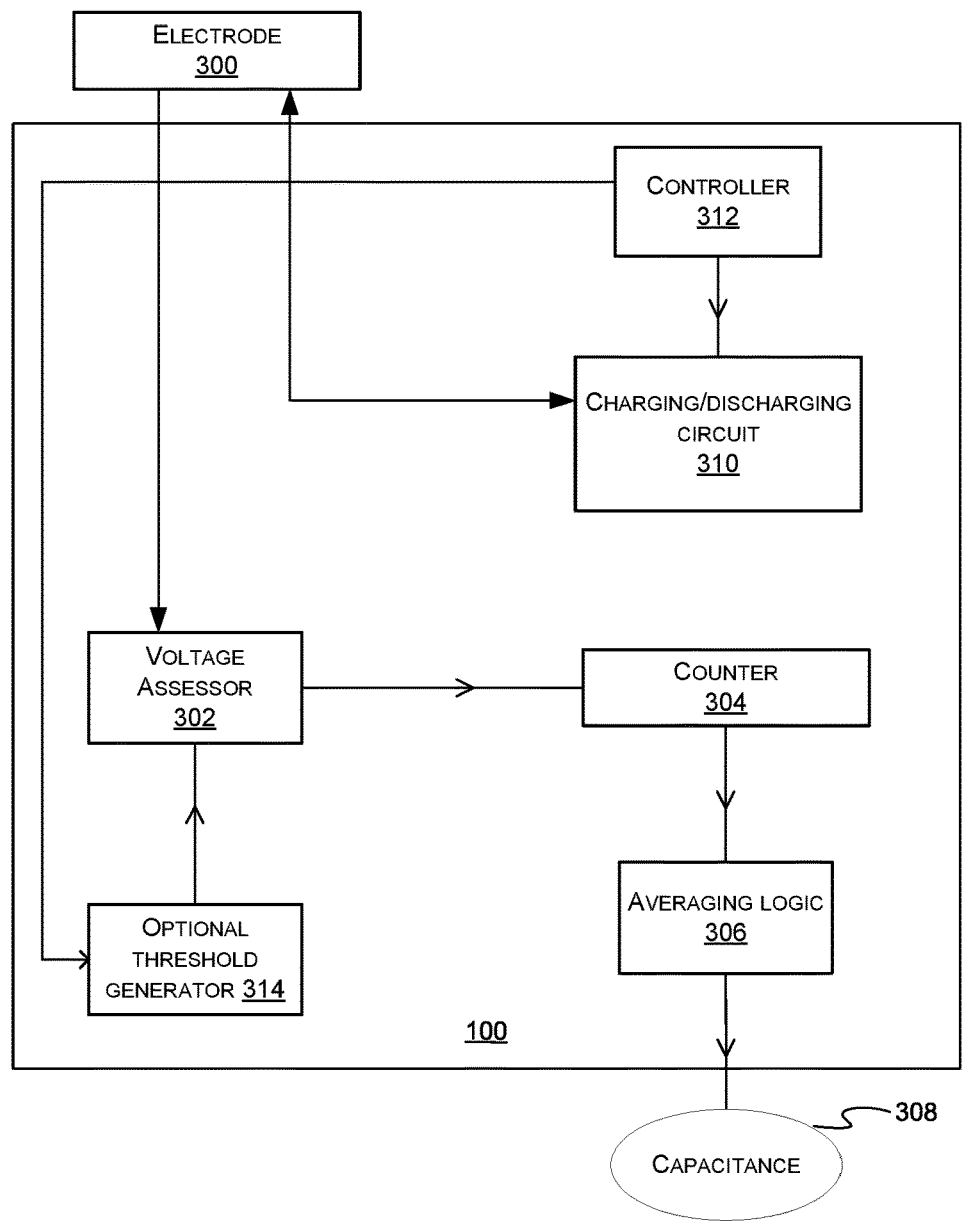
FIG. 3 is a schematic diagram of the capacitance measuring circuit of FIG. 1 in more detail.

FIG. 3 is a schematic diagram of the capacitance measuring circuit 100 in more detail, and connected to an electrode 300 so as to measure the capacitance of the electrode. The electrode is an electrode of a touch panel sensor, stylus or pressure sensor which are not shown in FIG. 3 for clarity.

The capacitance measuring circuit 100 comprises a voltage assessor 302, which measures a voltage of the electrode 300 and compares the voltage with one or more specified voltages, also referred to as thresholds or reference voltages. The voltage assessor 302 comprises either one or two comparators in some examples as described in more detail below. The voltage assessor 302 is connected to a counter 304 which counts a clock signal in order to measure time durations. The counter 304 is connected to an averaging logic 306 which averages a plurality of time durations, or inverses of time durations of the counter 304, in order to compute the capacitance value 308 output by the capacitance measuring circuit 100.

The capacitance measuring circuit 100 comprises a charging/discharging circuit 310 for connection to the electrode. The charging/discharging circuit 310 acts to either apply a current to the electrode 300 in order to charge the electrode 300, or it acts to discharge the electrode 300 by sinking current from it. Thus the charging/discharging circuit 310 comprises functionality to charge the electrode, such as a current source, or a voltage source connected through an impedance. The charging/discharging circuit also comprises functionality to discharge the electrode, such as a current sink, or an impedance connected to ground. One or more switches are present in the charging/discharging circuit 310 to enable switching between charging and discharging of the electrode 300.

A controller 312 is connected to the charging/discharging circuit 300. The switch(es) in the charging/discharging circuit 310 are controlled according to the values of the bits.

In some examples, the capacitance measuring circuit 100 comprises a threshold generator 314. However, this component is optional. The threshold generator determines reference voltages, also referred to as thresholds, for use by the voltage assessor 302 in cases where the thresholds are changed dynamically during use of the capacitance measuring circuit 100.

Figure 4A:
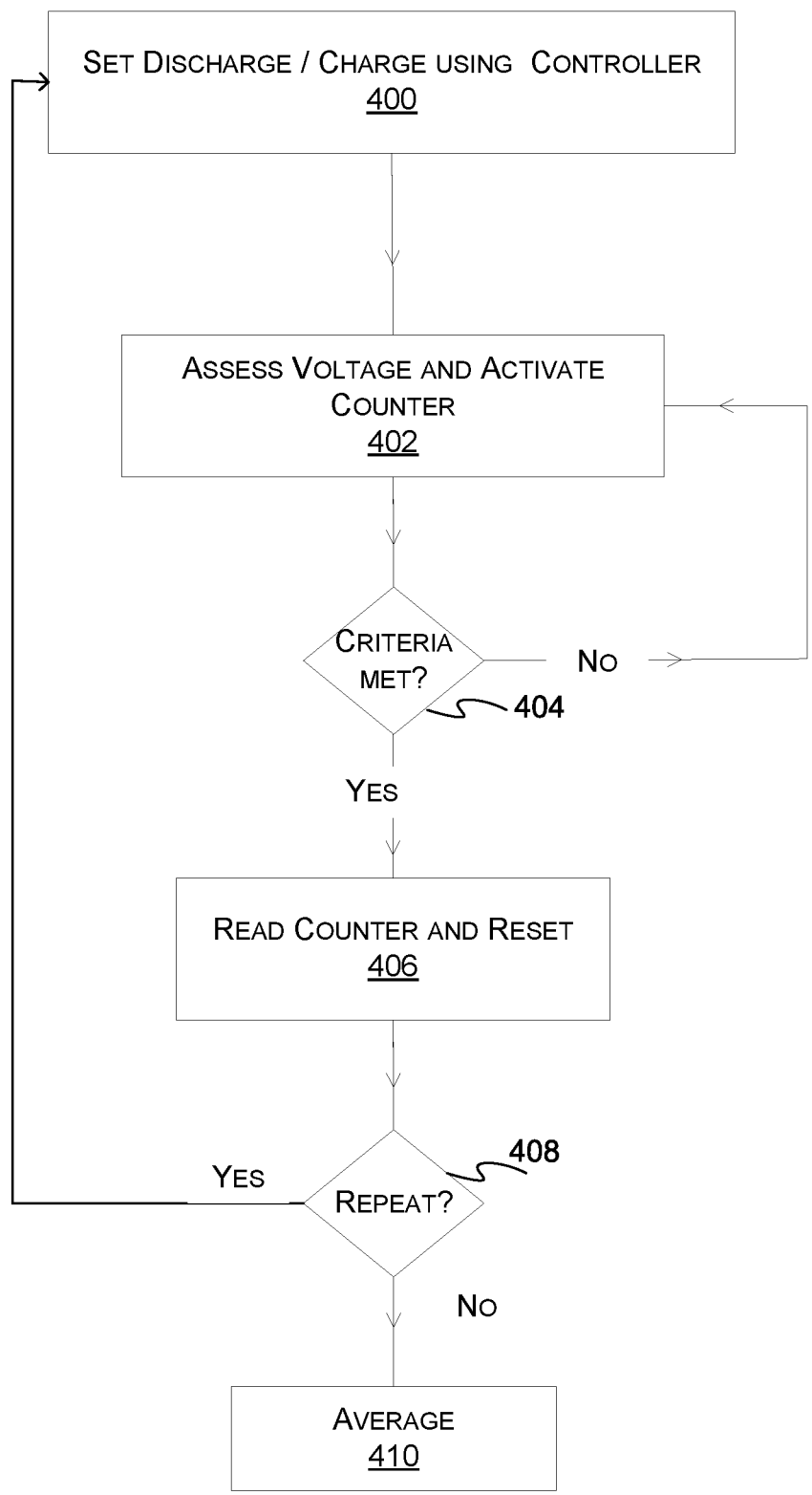
FIG. 4A is a flow diagram of a method of operation of the capacitance measuring circuit of FIG. 3.

FIG. 4A is a flow diagram of a method of operation of the capacitance measuring circuit 100 of FIG. 3 in a case where there is no threshold generator. The charging/discharging circuit 310 is set 400 to either charge or discharge the electrode using the controller 312. This is done by sending a control signal from the controller 312 to the charging/discharging circuit 310 which specifies whether to charge or discharge the electrode. In this example, the control signal indicates that the electrode is to be charged and then discharged repetitively so that the electrode toggles between being charged and being discharged.

Suppose that the charging/discharging circuit 310 is set to charge the electrode. The initial voltage of the electrode is known. As the charging begins a voltage of the electrode is assessed. When a first threshold voltage is reached a counter is activated 402. The counter continues until criteria are met at check 404. The criteria include at least that the assessed voltage of the electrode has reached a a second specified charging threshold. As soon as the second specified charging threshold is met the counter is read 406 and reset. The read counter value is referred to as a charging measurement and is stored for use in an averaging process described in more detail later in this document. In some cases the first charging threshold is a fully discharged state of the electrode.

A check 408 is made as to whether to repeat the method. If a specified number of charging measurements and discharging measurements have been made the method proceeds to an averaging process 410 otherwise it repeats.

Suppose the method repeats and moves to operation 400 at which the controller sends a signal to the charging/discharging circuit 310 to discharge the electrode. Switches in the charging/discharging circuit 310 are operated to enable the electrode to be discharged. The voltage is assessed and as soon as a first threshold is crossed the counter is activated 402. Once criteria are met 404, such as the assessed voltage of the electrode reaches a second discharging threshold, the counter is read 406 and reset. The read counter value is referred to as a discharging measurement and is stored for use in the averaging process. In some cases the first discharging threshold is an initial voltage of the electrode, such as where the electrode is in a fully charged state.

As mentioned above the charging measurement is proportional to the capacitance of the electrode; and the discharging measurement is also proportional to the capacitance of the electrode.

In the case of low frequency noise which is assumed to be constant throughout the time of a charging measurement and throughout the time of a discharging measurement, it is possible to reject the low frequency noise by averaging the charging and discharging measurements. This is because the low frequency noise has opposite effects on the charging measurements from the discharging measurements so that these low frequency noise effects cancel one another out during the averaging process. Preferably the same number of charging measurements as discharging measurements are used to enable the low frequency noise effects to cancel one another out most effectively. At least one charging measurement and at least one discharging measurement are averaged in order to remove the low frequency noise.

In the case of high frequency noise which is variable through the time of a measurement (charging measurement or discharging measurement), the averaging of a plurality of measurements (charging measurements alone, or discharging measurements alone, or both charging and discharging measurements) tends to cancel out the effects of this high frequency noise. This is because the high frequency noise is assumed to be random and to have roughly the same bias of the measurements in both positive and negative directions which cancel through averaging. The greater the number of measurements which are averaged, the better the rejection of the high frequency noise.

The method of FIG. 4A averages a plurality of measurements where these include both charging measurements and discharging measurements and so the method of FIG. 4A creates immcircuit party to noise across the spectrum.

In some cases the method of FIG. 4A averages an inverse of each of the individual charging and discharging measurements. By computing the inverses and averaging those noise is further reduced since noise terms in the measurements cancel one another out during the averaging process as now explained using mathematical notation. An inverse of a measurement is one divided by the measurement. Assuming that the same magnitude of current I is used by the charging/discharging circuit 310 for both charging the electrode in a charging measurement, and discharging the electrode in a discharging measurement, the following mathematical expressions apply. In the examples described herein the same current source is used by the charging/discharging circuit 310 for both charging and discharging the electrode and this makes the noise rejection more effective. If the current value is different, the average of charging measurements with discharging measurements includes an error.

In the case of a charging measurement the following equation applies:

$$\Delta t_{charge} = C \cdot \frac{\Delta V}{I + I_{noise}}$$

Which is expressed in words as, the time counted by the counter whilst the electrode is charged from the first charging threshold to the second charging threshold is denoted $\Delta t_{charge}$ and is equal to the capacitance of the electrode C times the ratio of the change in voltage $\Delta V$ of the electrode to the sum of the current I applied to the electrode and the current applied to the electrode due to noise $I_{noise}$.

During discharging the following equation applies $$\Delta t_{discharge} = C \cdot \frac{-\Delta V}{-I + I_{noise}} = C \cdot \frac{\Delta V}{I - I_{noise}}$$

Which is expressed in words as the time counted by the counter whilst the electrode is discharged from the first discharge threshold to the second discharge threshold is equal to the capacitance of the electrode times the ratio of the reduction in voltage of the electrode to the sum of the negative current I applied to the electrode and the current applied to the electrode due to noise. This simplifies mathematically to the capacitance of the electrode times the ratio of the increase in voltage of the electrode divided by the current applied to the electrode minus the current applied to the electrode due to noise.

When the average is taken of the inverse of a charging measurement and the inverse of a discharging measurement, noise terms in the mathematical expressions cancel out and this makes the resulting capacitance value more accurate. The inverse of a charging measurement is:

$$\frac{1}{\Delta t_{charge}}$$

And the inverse of a discharging measurement is $$\frac{1}{\Delta t_{discharge}}$$

The inverse of the average of the above two inverses is $$\left(\frac{\frac{1}{\Delta t_{charge}} + \frac{1}{\Delta t_{discharge}}}{2}\right)^{-1}$$

Which is written fully as $$\left(\frac{\frac{I+I_{noise}}{C \cdot \Delta V} + \frac{I-I_{noise}}{C \cdot \Delta V}}{2}\right)^{-1}$$

And which is simplified to $$\left(\frac{I}{C \cdot \Delta V}\right)^{-1}$$

Which is equal to $$\frac{C \cdot \Delta V}{I}$$

Thus the inverse of the average of inverses of a charging measurement and a discharging measurement is equal to the capacitance of the electrode, times the change in voltage of the electrode, divided by the current applied to the electrode, without any influence of noise. Since the change in voltage of the electrode and the current applied to the electrode are known the capacitance is calculated from the above equation in a highly accurate manner which rejects noise. Although the average is shown above for only two measurements it is extendible other numbers of measurements.

The method of FIG. 4A toggles consistently between a charging and a discharging measurement. The method of FIG. 4A is a good working approach for many practical applications where noise is absent in the surrounding frequencies of the toggling frequency and its harmonics.

In cases where noise is present in the surrounding frequencies of the toggling frequency and its harmonics this type of noise cannot be reduced by averaging charging measurements with discharging measurements as described with reference to FIG. 4A. To address this the toggling is made random, but with substantially the same number of charging measurements as discharging measurements in a specified total number of measurements. This is now described with reference to FIG. 4B.

A pseudo-random number generator is used to generate a sequence of random bits comprising a specified total number of bits with an approximately equal number of ones and zeros. The pseudo-random number generator is a linear feedback shift register (LFSR) or any other pseudo-random number generator, and is incorporated in the controller (312 of FIG. 3). The bits are used to control the charge/discharge circuit such that the value of a bit specifies whether a charging measurement is to be done, or a discharging measurement is to be done.

Since the bits in the sequence are random the sequence has some successive ones and/or some successive zeros. This means that there are cases where charging measurements are done one after another, and discharging measurements are done one after another. However, it is not straightforward to allow for this because various problems arise as a result. For example, after a charging measurement has taken place, the electrode may need to be discharged before another charging measurement can take place. This is time consuming and reduces speed and resolution with which the capacitance measurements are achieved. The same also applies for discharging measurements where the electrode may need to be charged before another discharging measurement can take place. To deal with this problem the thresholds of the charging or discharging measurements are dynamically determined during the measurement process in such a way as to avoid the need to bring the electrode into a particular state before beginning a successive measurement.

Another problem is that voltage jumps are introduced when switching between charging and discharging of the electrode. These jumps occur due to equivalent series resistance between the electrode and the measured capacitance. This resistance can occur due to the resistance of the path to the capacitor (such as wires) or due to the fact that the capacitor itself is not an ideal capacitor, and so it contains an equivalent series resistance that is not zero. These voltage jumps affect the capacitance measurements where the voltage jumps occur between the charging thresholds, or between the discharging thresholds. To address this, the thresholds are specially determined to avoid clash with the voltage jumps. This is explained in more detail later in this document.

Another problem is that if successive charging (or successive discharging) measurements take place quickly there is a risk of reading the counter at a point which is not truly at the end of a measurement. This leads to inaccuracy in the results. Another problem is that there is a risk of not resetting the counter at the correct point before a new measurement begins. Again this introduces inaccuracy. To deal with this problem a buffer zone is introduced as described in more detail later in this document.

The method of FIG. 4A uses threshold determination and buffer zones as mentioned above. However, it is possible to omit one or more of these features and still have a working solution. For example, the buffer zone may be omitted in some cases especially where reading and resetting of the counter is extremely fast. For example, the mechanism that addresses voltage jumps may not be required in cases where the voltage jumps are small enough such that they do not reach deep between the charging/discharging thresholds. This will be the case when the equivalent series resistance of the measured capacitance is small. Also, if the equivalent series resistance and the charging/discharging current source values are known, there is an option to compensate the voltage jump's effect by using digital post-processing of the measurement. For example, if the ratio of the change in voltage $\Delta V$ is 100 mV and the jump is known to penetrate 50 mV between the charging/discharging thresholds, then the time measurement must be doubled in order to get the correct value.

With reference to FIG. 4 the charging/discharging circuit part receives 412 a pseudo-random bit from a pseudo-random bit sequence 428. The pseudo-random bit sequence is generated by a linear feedback shift register which generates a repetitive stream with an even number of bits with approximately the same number of zeros as there are ones. Other types of pseudo-random bit generator may be used.

According to the value of the received pseudo-random bit, the charging/discharging circuit configures 414 its switches to either charge or discharge the electrode. A threshold generator (314 of FIG. 3) determines 416 values of the charging thresholds or the discharging thresholds by taking into account thresholds used in previous measurements and also by keeping an interval substantially constant between a first charging threshold and a second charging threshold, and between a first discharging threshold and a second discharging threshold. In some cases the threshold generator interleaves the charging and discharging thresholds and this is also referred to as staggering the charging and discharging thresholds. The threshold generator 314 also determines a buffer zone between the last threshold of a current measurement and the first threshold of the subsequent measurement. This is done by introducing a fixed size voltage gap between the last threshold of each measurement and the first threshold of each subsequent measurement.

The charging/discharging circuit begins to charge or discharge the electrode. The voltage of the electrode is assessed 418 against the thresholds determined by the threshold generator and a counter is activated once the first threshold is met. This is done using one or more comparators as described later in this document. The counter begins counting after the first threshold is crossed. If criteria are met 420, whereby the voltage moves from the first threshold to the second threshold, the counter is read 422 as soon as the second threshold is reached. Once the counter is read it is reset and a decision is made about whether to repeat 424. If there are more pseudo-random bits in the sequence the method repeats from step 414 using the next pseudo-random bit to configure the charge/discharge circuit part. If there are no further pseudo-random bits in the sequence the process moves to operation 426 at which point the average 426 of the inverses of the counter readings is computed and output as the measured capacitance of the electrode.

Figure 5:
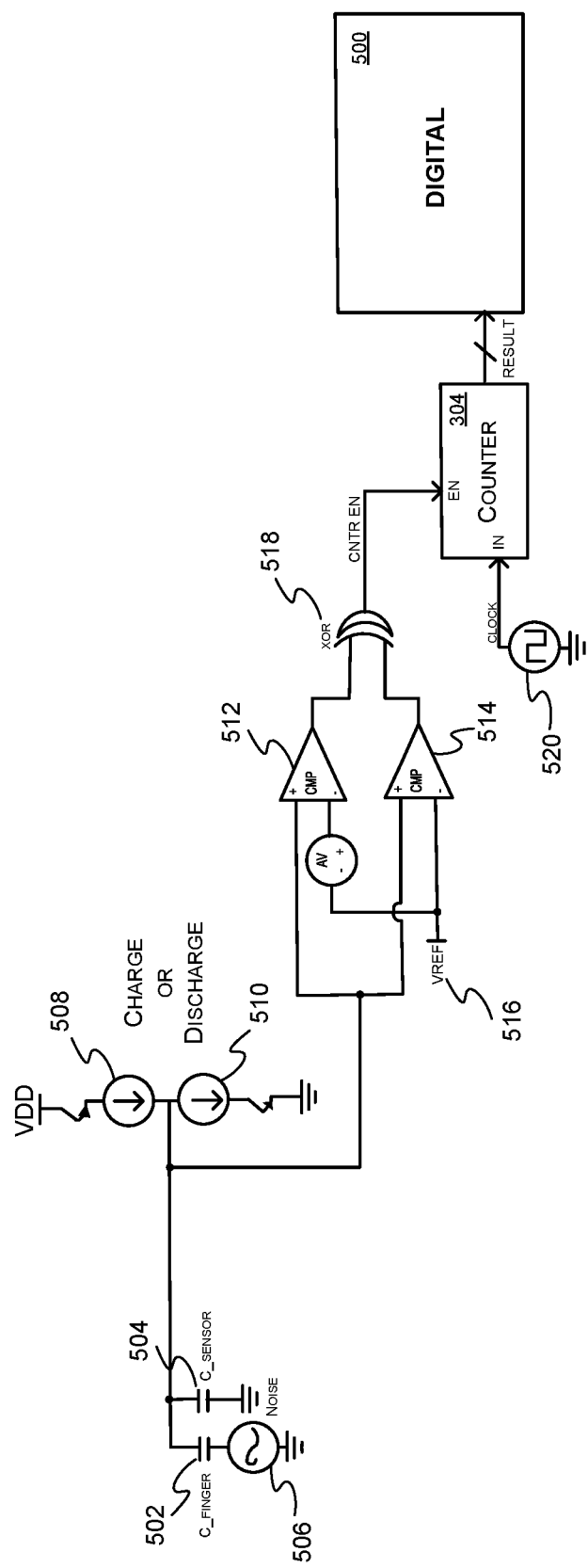
FIG. 5 is a circuit diagram of another example of a capacitance measuring circuit.

FIG. 5 is a circuit diagram of a capacitance measuring circuit for implementing the method of FIG. 4A. The electrode is represented by two capacitors 502, 504, one for the electrode and one for a finger of a user which may be influencing the electrode. Noise in the environment (high frequency and/or low frequency noise) is represented by symbol 506 in the circuit diagram. Noise may penetrate the circuit through other paths other than a user's finger, although this is a typical scenario for a touch sensing system. A charging/discharging circuit part 508, 510 comprises switches which are configurable to either enable the electrode to be charged or discharged. The charging/discharging circuit part 508, 510 toggles between charging and discharging under the control of a controller represented as a digital component 500 in FIG. 5.

The voltage of the electrode 502, 504 is assessed by two comparators 512, 514. One of the comparators is connected to a reference voltage 516 and compares the voltage of the electrode to that reference voltage 516 which is a first threshold. The other comparator 512 is connected to the same reference voltage 516 via a fixed step change in voltage to provide the second threshold. In this example the first and second thresholds are fixed. If the voltage of the electrode 502, 504 is above both thresholds the signals output by the comparators, when combined with an exclusive or, trigger a counter 304 to stop. The counter counts ticks of a clock 520 when the voltage on the electrode is between the first and second threshold. The counter result is latched and stored in the digital component 500 and the counter is reset.

Figure 4B:
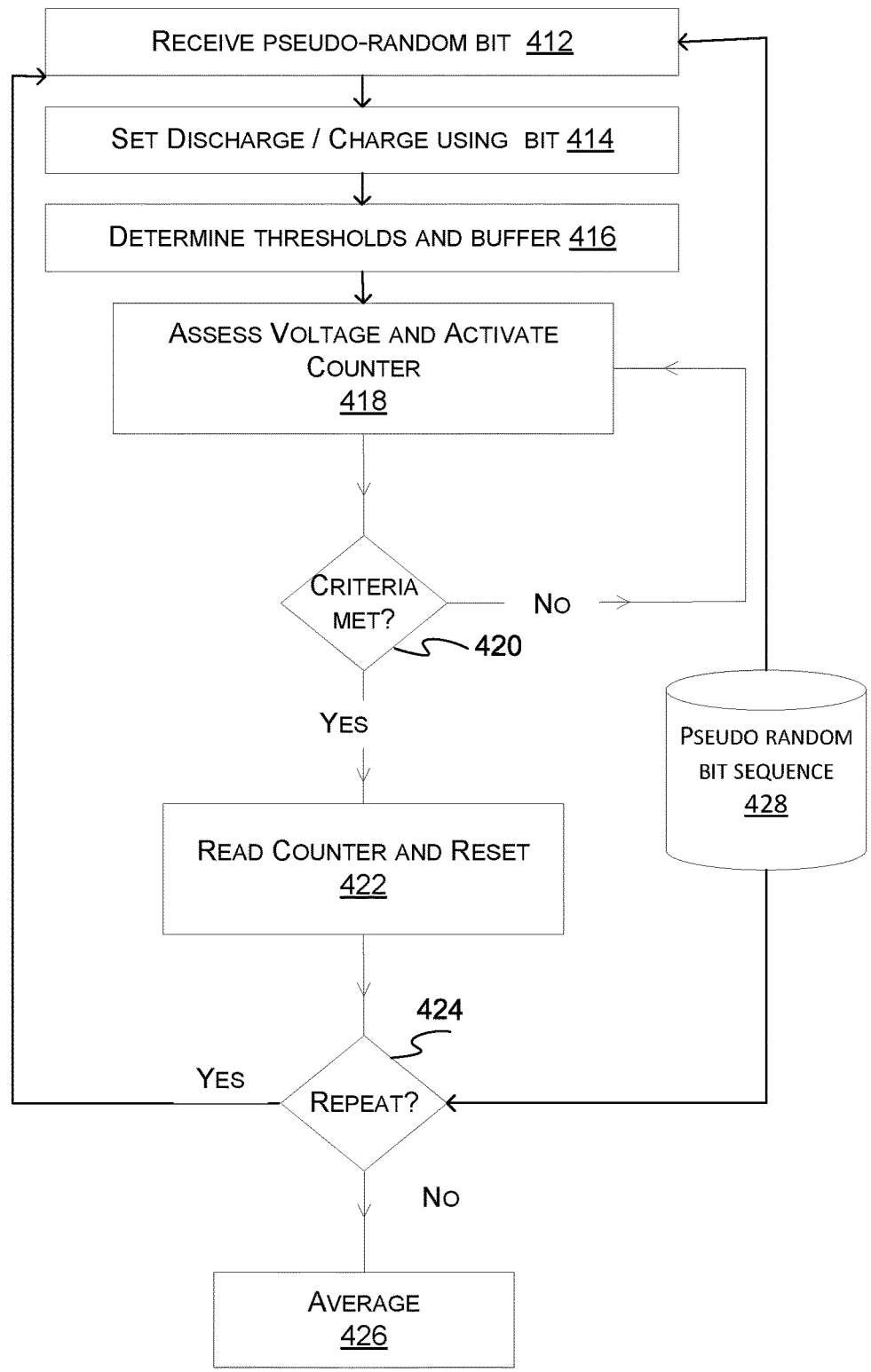
FIG. 4B is a flow diagram of another method of operation of the capacitance measuring circuit of FIG. 3.
Figure 6:
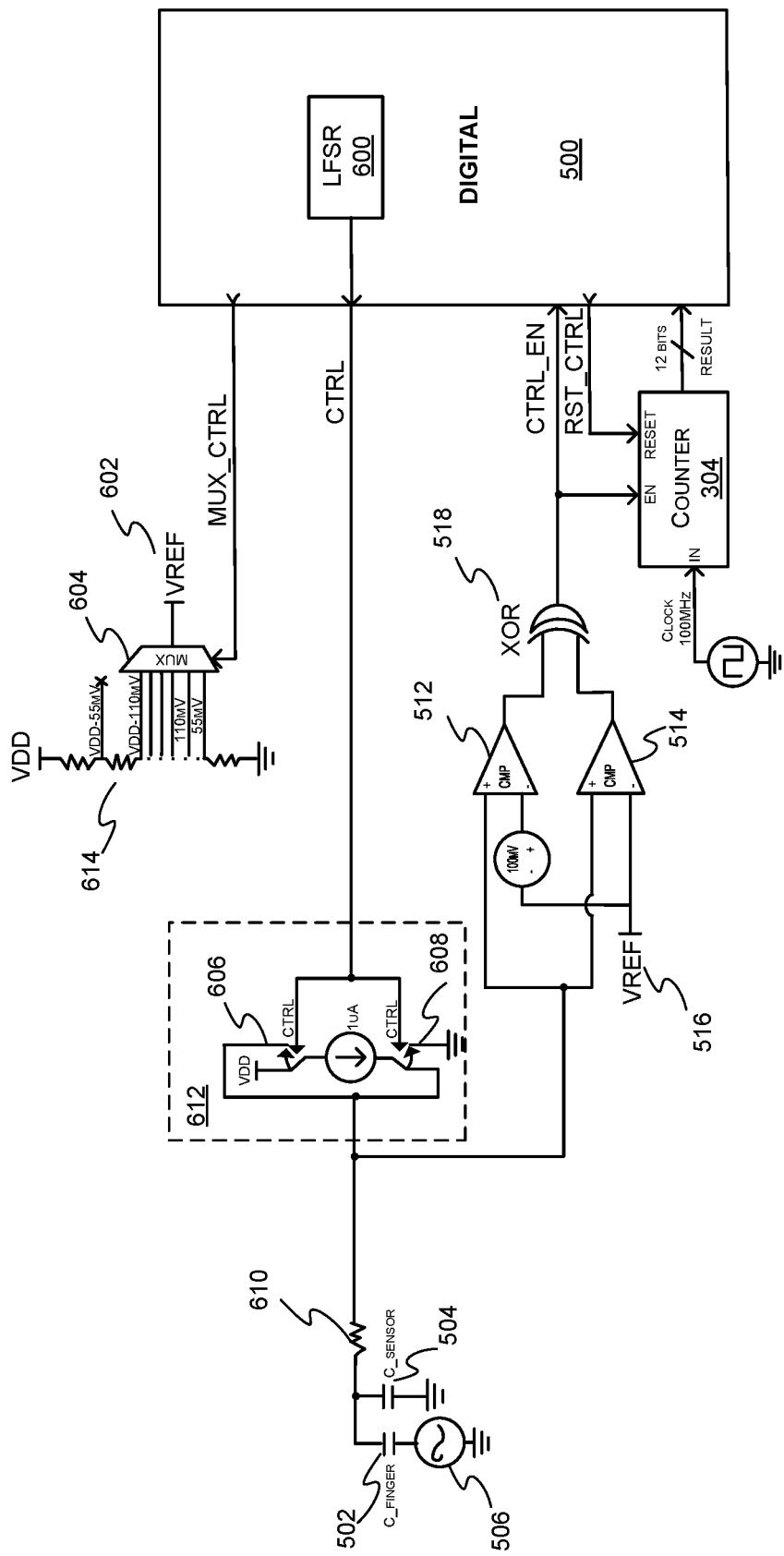
FIG. 6 is a circuit diagram of another example of a capacitance measuring circuit.

FIG. 6 is a circuit diagram of a capacitance measuring circuit implementing the method of FIG. 4B. In this example the electrode is represented using two capacitors 502, 504 as in FIG. 5 and noise is shown in the same way as for FIG. 5. A resistor 610 is shown and this represents the equivalent resistance between the measured capacitor and the measuring circuit which is introduced by the resistance of indium tin oxide, metal runners, traces, and the equivalent series resistance of a non-ideal capacitor. This resistance can reach as high of 4 kilo Ohms in some touch sensors.

The charging/discharging circuit part 612 in FIG. 6 comprises switches 606, 608 to enable the electrode to either be charged or discharged. The charging/discharging circuit part receives control signals from a linear feedback shift register 600 in the digital component 500 representing the controller.

The voltage of the electrode is assessed by two comparators 512, 514 in the same manner as for FIG. 5 and outputs of the comparators are combined using an exclusive or operator 518 which triggers the counter 304. The counter counts ticks of a clock as in FIG. 5 and results of the counter are latched from the counter 304 by the digital component 500. The digital component sends a signal to reset the counter 304 when appropriate. The digital component 500 receives an enable signal from the counter 304 which indicates when a measurement has ended. The digital component 500 latches the counter result once a measurement has ended. After the pseudo random bit sequence has ended the digital component 500 averages the inverses of the measurements to compute the final capacitance value.

FIG. 6 shows a threshold generator comprising a resistor ladder 614 and a multiplexer (MUX) 604. The digital component 500 automatically selects the lower threshold (vref 602) of the next measurement by controlling the multiplexer. This is done by implementing the following rules in the digital component 500, where the current measurement has used position j in the resistor ladder.

If the current measurement is a charging measurement, and the next measurement is a charging measurement then choose the j+2 position in the resistor ladder as the value of the first threshold vref 602 for the next measurement.

If the current measurement is a charging measurement, and the next measurement is a discharging measurement then choose the j−1 position in the resistor ladder for the value of the first threshold vref 602 for the next measurement.

If the current measurement is a discharging measurement, and if the next measurement is a charging measurement, then choose the j+1 position in the resistor ladder for the value of the first threshold vref 602 of the next measurement.

If the current measurement is a discharging measurement, and the next measurement is a discharging measurement then choose the position j−2 in the resistor ladder for the value of the first threshold vref 602 of the next measurement.

In some examples the resistor divider ladder 614 of FIG. 6 is replaced by a pulse width modulation (PWM) controlled voltage.

Figure 7:
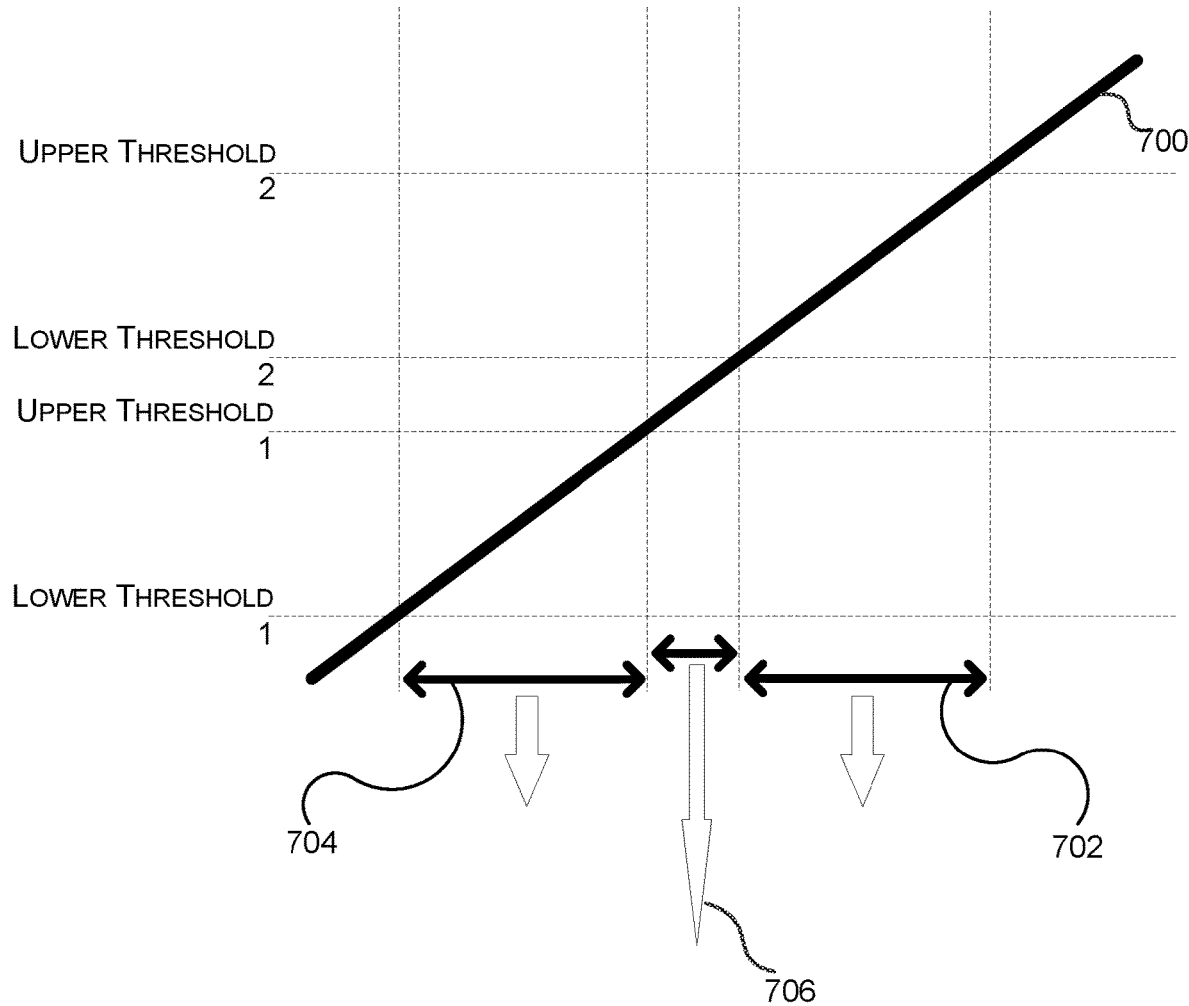
FIG. 7 is a schematic diagram of a buffer zone.

As mentioned above, in order not to have the need to discharge the electrode between two successive charging measurements (or to charge the electrode between two successive discharging measurements) the charging and discharging thresholds are changed dynamically during operation. As illustrated in FIG. 7 there are two successive charging measurements 704, 702 of the electrode. The voltage of the electrode increases as indicated by line 700 as a result. For the first measurement the time taken to charge the electrode from lower threshold 1 to upper threshold 1 is measured. A buffer zone 706 is introduced between upper threshold 1 and lower threshold 2, where lower threshold 2 is the first threshold of the second measurement. For the second measurement the time taken to charge the electrode from lower threshold 2 to upper threshold 2 is measured.

The buffer zone 706 allows the counter result to be read by the controller and for the counter to be reset before the next measurement starts.

It is recognized herein that the resistor 610 of FIG. 6 does not influence the results of the capacitance measuring circuit. This is because when using a current source to charge the electrode, this resistor 610 creates a constant voltage offset which is equal to the current (applied by the charging/discharging circuit) times the resistance of resistor 610.

Because the measurement time starts after the voltage on the electrode has passed the first threshold, and not immediately when the charging/discharging circuit begins, then this offset will not have any effect on the measurement. It creates a constant voltage offset throughout the measurement which affects the crossing of the low threshold in the same way as it affects the crossing of the high threshold. Thus the measured time is not affected.

Figure 8A:
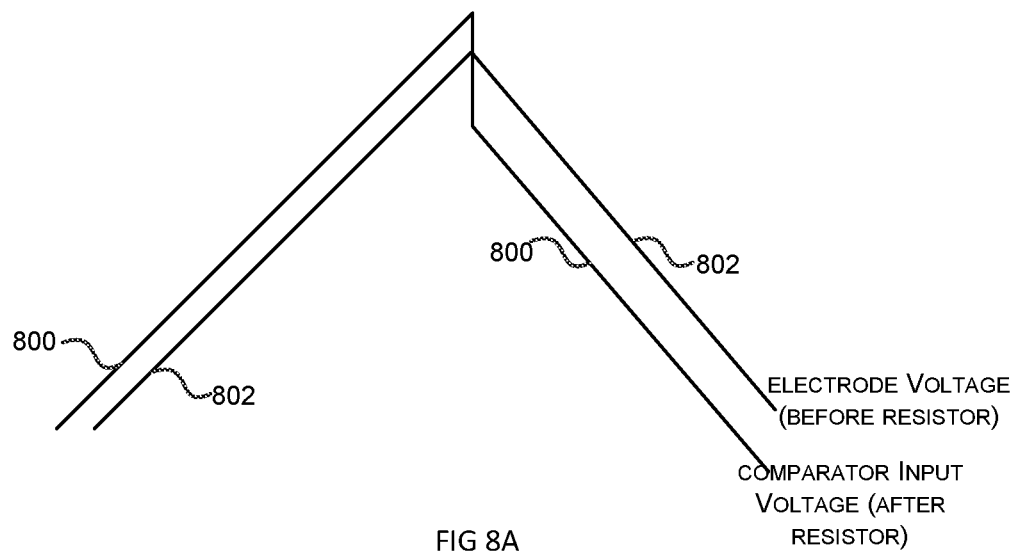
FIG. 8A is a graph of capacitor voltage and comparator input voltage.

As mentioned above voltage jumps occur when the charging/discharging circuit of FIG. 6 switches between charging and discharging. As a result of a voltage jump the comparators experience a sudden input change. This is because the offset caused by resistor 610 abruptly changes from positive to negative, or from negative to positive. For a 1 micro Ampere current source and a 4 kilo Ohm resistor 610 there is a voltage jump of 8 milli volts between charging and discharging measurements. FIG. 8A shows the comparator input voltage 800 increasing from left to right, making a sudden drop, and then decreasing from left to right. In contrast the electrode voltage measured before resistor 610 has no sudden drop corresponding to the sudden drop of the comparator input voltage.

This voltage jump only affects the measurement of the capacitance if it is present in the active area of the comparators, where the active area of the comparators is between the charging thresholds or the discharging thresholds of the next measurement. For example, assume the current measurement is a charging measurement and the circuit samples the rise time between 300 milli volts and 400 milli volts. If the next measurement is a discharging measurement, the jump of the voltage disrupts the fall time between 400 milli volts and 300 milli volts.

Figure 8B:
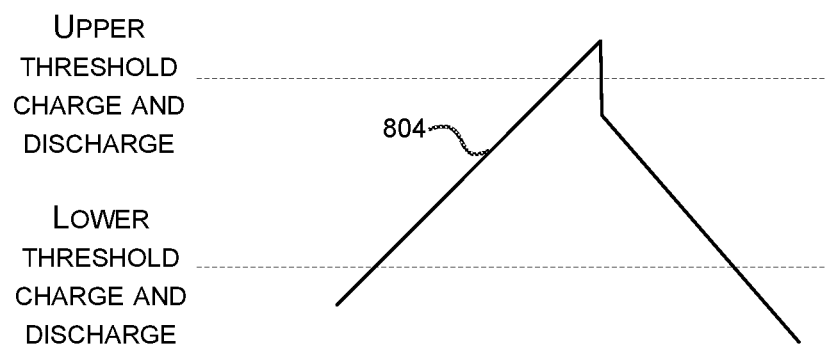
FIG. 8B is a graph of comparator input voltage and showing charging and discharging thresholds.
Figure 8B:
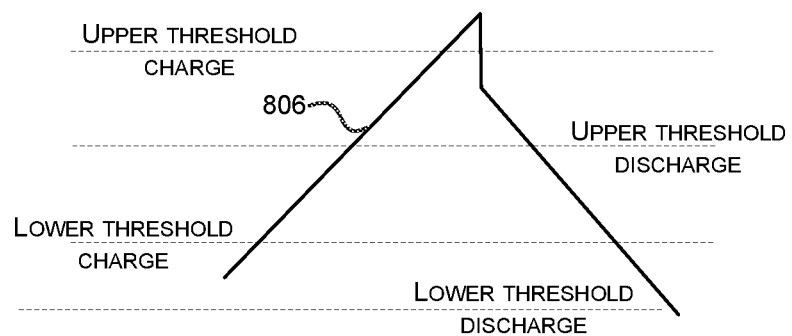

To address the problem of the voltage jumps in the active area of the comparators, the charging and discharging thresholds are staggered or interleaved as illustrated in FIG. 8B and in FIG. 9. FIG. 8B shows the comparator input voltage after the resistor 610 which is the same as for FIG. 8A. In addition FIG. 8B shows the values of the charging and discharging thresholds in two scenarios. In the scenario on the left hand side of FIG. 8B the lower threshold of both the charging and discharging measurements are the same, and the upper thresholds of both the charging and discharging measurements are the same. This gives poor results because the voltage jump occurs in the region between the lower and upper thresholds and so it affects the time taken for charging or discharging and impairs the results. In the scenario on the right hand side of FIG. 8B the thresholds are interleaved so that the lower charging threshold is between the discharge thresholds. Also, the upper discharge threshold is between the charging thresholds. In this way the voltage jump does not occur within the charging measurement or within the discharging measurement.

Figure 9A:
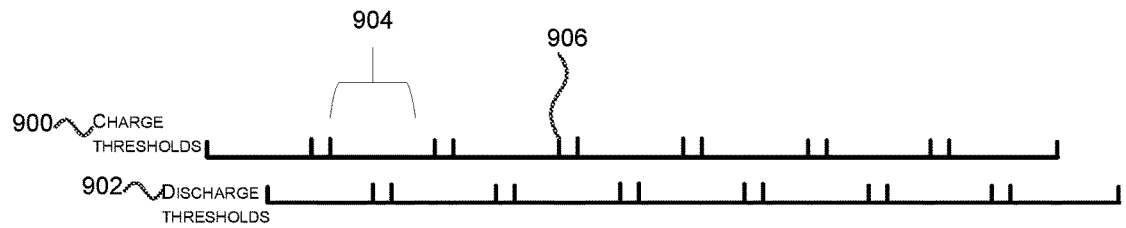
FIG. 9A is a schematic diagram of interleaving of charging and discharging thresholds.
Figure 9B:
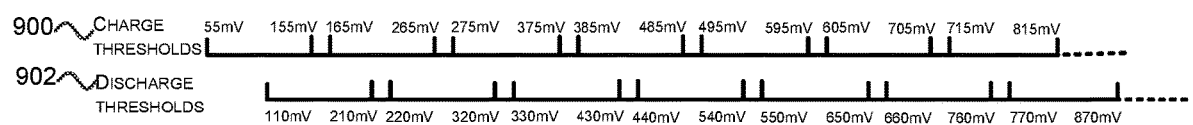
FIG. 9B is a copy of FIG. 9A and with example charging and discharging threshold values added.

The interleaving of the charging and discharging thresholds is also illustrated in FIG. 9A which shows the charging thresholds on the upper line 900 and the discharging thresholds on the lower line 902 with the length of the lines representing the full voltage range that the circuit is operating on. It is seen that constant intervals 904 are used for the charging measurements and the discharging measurements and the buffer zones 906 are also illustrated. FIG. 9B shows the charging thresholds on the upper line 900 and the discharging thresholds on the lower line 902 and gives numerical values of the thresholds in milli volts for this one example, which is not intended to limit the scope of the technology. FIG. 9B illustrates how the intervals are all of 100 milli volts and the buffer zones are all of 10 milli volts although other values are used in some examples. Note that the absolute values of the thresholds do not need to be accurate as long as the difference between each upper threshold and lower threshold is constant. This is achieved by using a resistor divider ladder or a pulse width modulation controlled voltage to determine the lower threshold. The upper threshold is the sum of the lower threshold and a direct current voltage source. By using the same direct current voltage source for all thresholds the difference between the upper and lower thresholds is constant.

Figure 10:
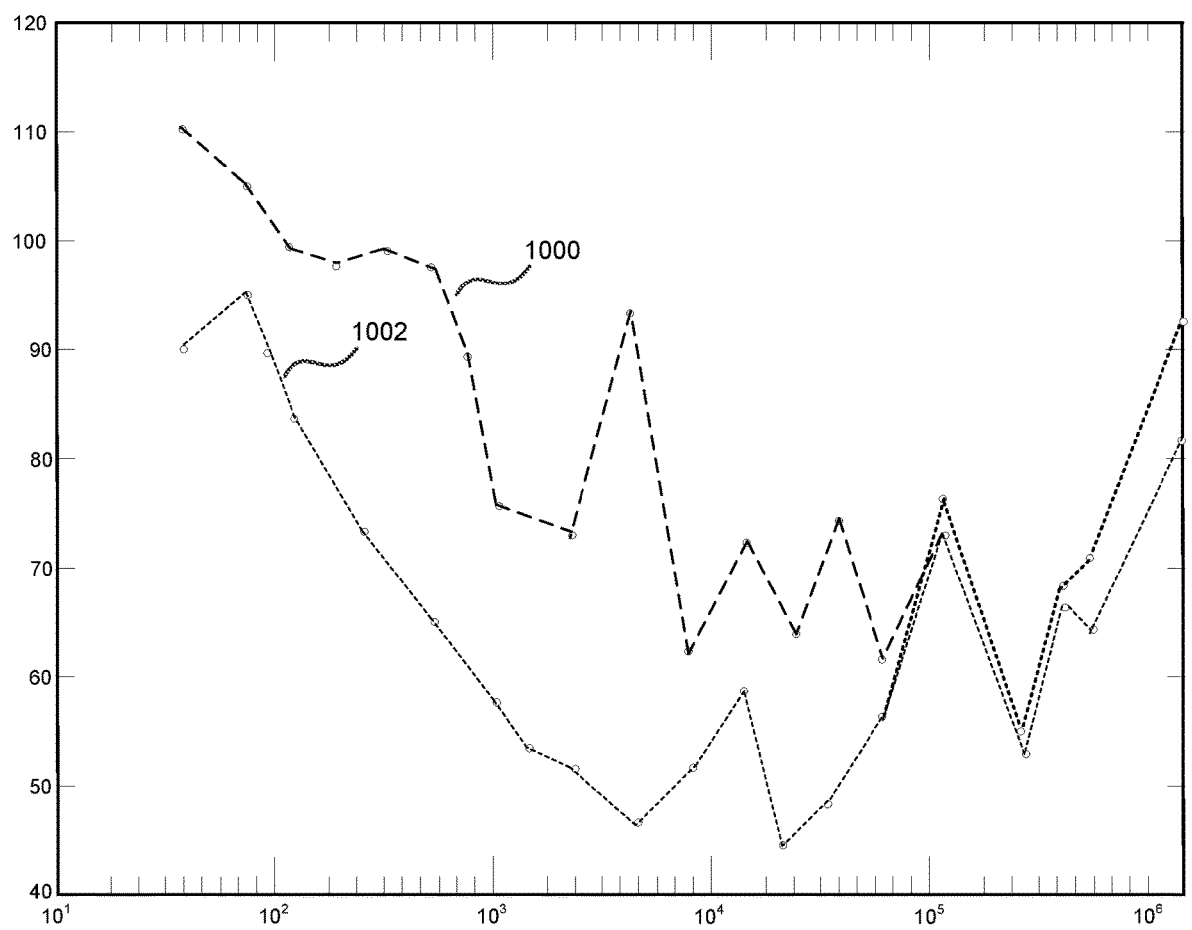
FIG. 10 is a graph of signal to noise ratio obtained using the capacitance measuring circuit of FIG. 6.

FIG. 10 shows a graph of signal to noise ratio for the circuit of FIG. 6 with the following parameter values:

Sensor capacitance 491.1 pico Farads (a non round value was chosen in order to challenge the circuit).

Clock frequency 200 Mega Hertz.

Difference between the comparator thresholds, 200 milli volts.

Linear feedback shift register series length, 96 bits.

Current source 13 micro Amps.

Sensor resistance 4 kilo Ohms.

In the graph of FIG. 10 the x axis represents the frequency in Hertz of a known noise source injected into the capacitor, and they axis represents the observed signal to noise ratio in decibels. A noise source of a 1 micro Ampere sine current source was injected to the capacitor in different frequencies between 50 Hertz and 1 Mega Hertz (see the x axis of the graph in FIG. 10). For each frequency measurements with 20 different phases of the noise were taken. For each frequency two signal to noise ratios were computed. A first signal to noise ratio was computed as the signal to noise ratio of the deviation of the 20 samples in comparison with the known capacitance and this is illustrated in FIG. 10 as line 1000. A second signal to noise ratio was computed as the absolute error of the average of the 20 samples, in comparison to the known capacitance, and this is illustrated in FIG. 10 as line 1002. A signal to noise ratio which is above zero indicates more signal than noise. As seen in FIG. 10 the signal to noise ratio is well above zero for all conditions investigated which demonstrates that noise is rejected extremely well using the apparatus and methods described herein. The worst case scenario of FIG. 10 is the signal to noise ratio of 45 decibels which occurs at a noise frequency of about 25 kilo Hertz. A signal to noise ratio of 45 decibels is well above zero and so in fact, the worst case scenario is extremely good. This demonstrates that the apparatus and methods described herein are extremely effective at rejection of noise.

Alternatively or in addition to the other examples described herein, examples include any combination of the following:

A capacitance measurement circuit for measuring capacitance of an electrode, the circuit comprising:
- a charging/discharging circuit part which charges the electrode or discharges the electrode;
- a counter which measures a charging measurement being a time taken by the charging/discharging circuit part to charge the electrode between two charging thresholds, and which measures a discharging measurement being a time taken by the charging/discharging circuit part to discharge the electrode between two discharging thresholds;
- a controller configured to control the charging/discharging circuit part and the counter such that a plurality of discharging measurements are obtained and a plurality of charging measurements are obtained;
- an averaging logic which computes the measured capacitance in relation to an average of the measurements.

The capacitance measurement circuit described above wherein the averaging logic computes an average of an inverse of each of the plurality of measurements.

The capacitance measurement circuit described above wherein the controller is configured to control the charging/discharging circuit part and the counter such that the number of charging measurements is approximately equal to the number of discharging measurements.

The capacitance measurement circuit described above wherein the controller comprises a pseudo-random number generator configured to generate a sequence comprising a specified number of random bits and wherein the controller is configured to control the charging/discharging circuit part and the counter such that the charging and discharging measurements are carried out in a sequence which corresponds to the sequence of random bits.

The capacitance measurement circuit described above comprising a threshold determiner configured to determine the charging thresholds and the discharging thresholds used by the voltage assessor such that when a current bit of the bit sequence has the same value as the immediately previous bit of the bit sequence the charging thresholds are determined to be greater than the immediately previous charging thresholds, or the discharging thresholds are determined to be less than the previous discharging thresholds.

The capacitance measurement circuit described above wherein the threshold determiner is configured to ensure there is a buffer zone comprising a voltage interval in which there are no charging or discharging thresholds determined by the threshold determiner, the buffer zone being between the smaller of the two charging thresholds, and the larger of the previous two charging thresholds or between the larger of the two discharging thresholds, and the smaller of the previous two discharging thresholds.

The capacitance measurement circuit described above wherein the threshold determiner is configured to interleave the charging and discharging thresholds.

The capacitance measurement circuit described above wherein the threshold determiner is configured to determine the charging and discharging thresholds such that a difference between a pair of charging or discharging thresholds is generally constant.

The capacitance measurement circuit described above wherein the threshold determiner comprises a resistor divider ladder or a pulse width modulation controlled voltage.

The capacitance measurement circuit described above wherein the resistor divider ladder or the pulse width modulation controlled voltage is configured to compute a lower one of a pair of charging thresholds or a lower one of a pair of discharging thresholds, and a direct current voltage source which, when combined with the lower voltage produces the upper voltage of the pair of voltages.

The capacitance measurement circuit described above wherein the charging/discharging circuit part comprises a single current source for both charging and discharging the electrode.

A method of measuring capacitance of an electrode comprising:
charging the electrode and discharging the electrode a plurality of times;
measuring, using a counter, each time the electrode is charged, a charging measurement being a time taken to charge the electrode between two charging threshold;
measuring, using the counter, each time the electrode is discharged, a discharging measurement being a time taken to discharge the electrode between two discharging thresholds; and
computing the measured capacitance in relation to an average of the measurements.

The method described above comprising computing the measured capacitance in relation to an average of an inverse of each of the plurality of measurements.

The method described above comprising making the number of charging measurements approximately equal to the number of discharging measurements.

The method described above comprising generating a sequence comprising a specified number of pseudo-random bits and carrying out the charging and discharging measurements in a sequence which corresponds to the sequence of pseudo-random bits.

The method described above comprising determining the charging thresholds and the discharging thresholds used by the voltage assessor such that: when a current bit of the bit sequence has the same value as the immediately previous bit of the bit sequence the charging thresholds are determined to be greater than the immediately previous charging thresholds, or the discharging thresholds are determined to be less than the immediately previous discharging thresholds; and such that when a current bit of the bit sequence has a different value from the immediately previous bit of the bit sequence, the charging thresholds are determined to be greater than the immediately previous discharging thresholds, or the discharging thresholds are determined to be less than the immediately previous charging thresholds.

The method described above comprising using a resistor divider ladder or a pulse width modulation controlled voltage to determine the charging thresholds and the discharging thresholds.

The method described above comprising creating a buffer zone comprising a voltage interval in which there are no charging or discharging thresholds, the buffer zone being between the smaller of the two charging thresholds, and the larger of the previous two charging thresholds or between the larger of the two discharging thresholds, and the smaller of the previous two discharging thresholds.

The method described above comprising interleaving the charging and discharging thresholds.

A capacitance measurement circuit for measuring capacitance of an electrode, the circuit comprising:
a charging/discharging circuit part which charges the electrode or discharges the electrode;
a counter which measures a charging measurement being a time taken by the charging/discharging circuit part to charge the electrode between two charging thresholds, and which measures a discharging measurement being a time taken by the charging/discharging circuit part to discharge the electrode between two discharging thresholds;
a controller configured to control the charging/discharging circuit part and the counter such that a plurality of discharging measurements are obtained and a plurality of charging measurements are obtained;
an averaging logic which computes the measured capacitance in relation to an average of an inverse of each of the measurements.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The operations of the methods described herein may be carried out in any suitable order, or simultaneously where appropriate. Additionally, individual blocks may be deleted from any of the methods without departing from the scope of the subject matter described herein. Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

The term 'subset' is used herein to refer to a proper subset such that a subset of a set does not comprise all the elements of the set (i.e. at least one of the elements of the set is missing from the subset).

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the scope of this specification.

The invention claimed is:

1. A capacitance measurement circuit for measuring capacitance of an electrode, the circuit comprising:
a charging/discharging circuit part which charges the electrode or discharges the electrode;
a counter that measures a first temporal time for the charging/discharging circuit to charge the electrode to a charging threshold and a second temporal time to discharge the electrode to a discharge threshold;
a controller configured to control the charging/discharging circuit part and the counter such that a plurality of discharging measurements are obtained and a plurality of charging measurements are obtained;
averaging logic that averages the first temporal time and the second temporal time to determine an average temporal time,
wherein the controller is further configured to determine the capacitance of the electrode based, at least in part, on the determined average temporal time.

2. The capacitance measurement circuit of claim 1 wherein the averaging logic computes an average of an inverse of each of the plurality of charging and discharging measurements.

3. The capacitance measurement circuit of claim 1 wherein the controller is configured to control the charging/discharging circuit part and the counter such that the number of charging measurements is approximately equal to the number of discharging measurements.

4. The capacitance measurement circuit of claim 1 wherein the controller comprises a pseudo-random number generator configured to generate a sequence comprising a specified number of random bits and wherein the controller is configured to control the charging/discharging circuit part and the counter such that the charging and discharging measurements are carried out in a sequence which corresponds to the sequence of random bits.

5. The capacitance measurement circuit of claim 1 comprising a threshold determiner configured to determine the charging thresholds comprising the charging threshold and discharging thresholds comprising the discharge threshold used by the voltage assessor such that when a current bit of the bit sequence has the same value as the immediately previous bit of the bit sequence the charging thresholds are determined to be greater than one or more previous charging thresholds, or the discharging thresholds are determined to be less than one or more previous discharging thresholds.

6. The capacitance measurement circuit of claim 5 wherein the threshold determiner is configured to ensure there is a buffer zone comprising a voltage interval in which there are no charging or discharging thresholds determined by the threshold determiner, the buffer zone being between the smaller of the charging threshold and the discharging threshold, and the larger of two previous charging thresholds or between the larger of two of the one or more discharging thresholds, and the smaller of two previous discharging thresholds.

7. The capacitance measurement circuit of claim 5 wherein the threshold determiner is configured to interleave the charging and discharging thresholds.

8. The capacitance measurement circuit of claim 5 wherein the threshold determiner is configured to determine the charging and discharging thresholds such that a difference between a pair of charging or discharging thresholds is constant.

9. The capacitance measurement circuit of claim 5 wherein the threshold determiner comprises a resistor divider ladder or a pulse width modulation controlled voltage.

10. The capacitance measurement circuit of claim 9 wherein the resistor divider ladder or the pulse width modulation controlled voltage is configured to compute a lower one of a pair of charging thresholds or a lower one of a pair of discharging thresholds, and a direct current voltage source which, when combined with the lower voltage produces the upper voltage of the pair of voltages.

11. The capacitance measurement circuit of claim 1 wherein the charging/discharging circuit part comprises a single current source for both charging and discharging the electrode.

12. A method of measuring capacitance of an electrode comprising:
charging the electrode and discharging the electrode a plurality of times;
measuring a first temporal time for the electrode to charge to a charging threshold;
measuring a second temporal time for the electrode to charge to a discharging threshold;
averaging the first temporal time and the second temporal time to determine an average temporal time;
computing the capacitance of the electrode based, at least in part, on the average temporal time.

13. The method of claim 12 comprising computing the capacitance in relation to, at least in part, an average of an inverse of first temporal time and the second temporal time.

14. The method of claim 12 comprising measuring a first set of temporal times to charge the electrode an equal number of times as measuring a second set of temporal times to discharge the electrode.

15. The method of claim 12 comprising generating a sequence comprising a specified number of pseudo-random bits and carrying out charging and discharging measurements in a sequence which corresponds to the sequence of pseudo-random bits.

16. The method of claim 12 comprising determining charging thresholds and discharging thresholds used by the voltage assessor such that: when a current bit of the bit sequence has the same value as the immediately previous bit of the bit sequence the charging thresholds are determined to be greater than the immediately previous charging thresholds, or the discharging thresholds are determined to be less than the immediately previous discharging thresholds; and such that when a current bit of the bit sequence has a different value from the immediately previous bit of the bit sequence, the charging thresholds are determined to be greater than the immediately previous discharging thresholds, or the discharging thresholds are determined to be less than the immediately previous charging thresholds.

17. The method of claim 16 comprising using a resistor divider ladder or a pulse width modulation controlled voltage to determine the charging threshold and the discharging threshold.

18. The method of claim 12 comprising creating a buffer zone comprising a voltage interval in which there are no charging or discharging thresholds, the buffer zone being between the smaller of two charging thresholds, and the larger of two previous charging thresholds or between the larger of two discharging thresholds, and the smaller of two previous discharging thresholds.

19. The method of claim 12 comprising interleaving the charging threshold and the discharging threshold.

20. A capacitance measurement circuit for measuring capacitance of an electrode, the circuit comprising:
 a charging/discharging circuit part which charges the electrode or discharges the electrode;
 a counter that measures a first temporal time for the charging/discharging circuit to charge the electrode to a charging threshold and a second temporal time to discharge the electrode to a discharge threshold;
 a controller configured to control the charging/discharging circuit part and the counter such that a plurality of discharging measurements are obtained and a plurality of charging measurements are obtained; and
 averaging logic that averages the first temporal time and the second temporal time to determine an average temporal time that is usable, at least in part, to determine the capacitance of the electrode.

* * * * *